(12) United States Patent
Menczigar et al.

(10) Patent No.: US 6,903,620 B2
(45) Date of Patent: Jun. 7, 2005

(54) CIRCUIT CONFIGURATION FOR SETTING THE INPUT RESISTANCE AND THE INPUT CAPACITANCE OF AN INTEGRATED SEMICONDUCTOR CIRCUIT CHIP

(75) Inventors: Ullrich Menczigar, Vaterstetten (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 31 days.

(21) Appl. No.: 10/452,477

(22) Filed: Jun. 2, 2003

(65) Prior Publication Data

US 2004/0032008 A1 Feb. 19, 2004

(30) Foreign Application Priority Data

May 31, 2002 (DE) .......................... 102 24 180

(51) Int. Cl.[7] .................................................. H03H 7/38
(52) U.S. Cl. .......................................... 333/32; 333/33
(58) Field of Search .............................. 333/32, 33, 247, 333/104; 257/786, 622, 623

(56) References Cited

U.S. PATENT DOCUMENTS 5,777,529 A * 7/1998 Lowe .......................... 333/33
6,294,841 B1 * 9/2001 Savignac et al. .......... 257/786

FOREIGN PATENT DOCUMENTS

DE 19825607 C2 8/2000

* cited by examiner

*Primary Examiner*—Peguy Jeanpierre
*Assistant Examiner*—Joseph Lauture
(74) *Attorney, Agent, or Firm*—Laurence A. Greenberg; Werner H. Stemer; Ralph E. Locher

(57) ABSTRACT

An RC network is integrated in a semiconductor circuit chip and is connected between an input pad or pin and a ground node coupled to a substrate of the chip. The RC network has a plurality of resistance elements, a plurality of capacitance elements and a plurality of connection/isolation elements, which are provided in each case between at least one of the resistance elements and the individual capacitive elements. The inventive circuit configuration enables an optional and independent setting of the input capacitance and of the input resistance of the semiconductor circuit chip, depending on the connection/isolation state of the connection/isolation elements.

11 Claims, 3 Drawing Sheets

CIRCUIT CONFIGURATION FOR SETTING THE INPUT RESISTANCE AND THE INPUT CAPACITANCE OF AN INTEGRATED SEMICONDUCTOR CIRCUIT CHIP

BACKGROUND OF THE INVENTION

FIELD OF THE INVENTION

The invention lies in the semiconductor technology field. More specifically, the invention relates to a circuit configuration for setting the input resistance and the input capacitance of an integrated semiconductor circuit chip.

In integrated circuits, it is often necessary to set the electrical characteristic input quantities, namely the input resistance R, the input inductance L and the input capacitance C, independently of one another within narrow limits. These characteristic input quantities are determined both by the housing and by the chip itself.

To date, the input capacitance C has been estimated and corresponding capacitances or capacitors have been positioned on the chip. For the input resistance R, to date there has not been a practicable setting possibility on the chip.

The accompanying FIG. 5 shows a simplified equivalent circuit diagram of the input structure of an integrated circuit. The input structure comprises an input capacitance C, an input resistance R, and an input inductance L. The inductance is determined almost exclusively by the housing of the integrated circuit. The values of the input capacitance C and of the input resistance R are combined values of all the capacitances and resistances in the input circuit of the integrated circuit. Since a common setting possibility for the input capacitance C and the input resistance R of integrated circuits has not been provided to date in the prior art, the situation has been able to arise in which the values for the input resistance R and the input capacitance C of the chip have not been within the fixed tolerance limits after production. Therefore, these values have only been able to be corrected subsequently by means of complicated additional structures (outside the chip). Independent setting of the input resistance R and of the input capacitance C has not been possible, however.

SUMMARY OF THE INVENTION

It is accordingly an object of the invention to provide a circuit configuration for setting the input resistance and the input capacitance of an integrated semiconductor chip which overcomes the above-mentioned disadvantages of the heretofore-known devices and methods of this general type and which allows the magnitude of the input capacitance and of the input resistance to be set separately using only one mask or using fuses in one step during chip fabrication.

With the foregoing and other objects in view there is provided, in accordance with the invention, a circuit configuration for setting the input resistance and the input capacitance of an integrated semiconductor circuit chip, the chip having an input (i.e., an input pad, an input pin, etc.) and a ground node coupled to a substrate. The novel circuit configuration comprises:

an RC network connected between the input and the ground node of the chip;

the RC network including a plurality of resistance elements, a plurality of capacitance elements, and a plurality of connection/isolation elements;

wherein the connection/isolation elements are disposed between at least some of the resistance elements and between the resistance elements and individual the capacitance elements, and the connection/isolation elements are configured to be selectively placed into a connection state or an isolation state jointly in one step for setting the input resistance and the input capacitance of the semiconductor circuit chip.

In other words, in a primarily important aspect of the invention, the circuit configuration has an RC network, which is connected between an input pad or pin of the chip and a ground node of the chip, the ground node being coupled to a substrate. The RC network comprises a plurality of resistance elements, a plurality of capacitance elements and a plurality of connection/isolation elements. The latter are provided in each case between at least some of the resistance elements among one another and between the resistance elements and the individual capacitance elements. The connection/isolation elements can optionally and selectively be brought into a connection or isolation state jointly in one step for the purpose of setting the input resistance and the input capacitance of the semiconductor circuit chip.

Preferably, the RC network has at least a first resistance series and a second resistance series, which is arranged in parallel with the first resistance series, of which the first resistance series has n first resistance elements in each case of a first resistance value, between which in each case at least one of the connection/isolation elements is arranged, and the second resistance series has m second resistance elements in each case of a second resistance value, between which in each case at least one of the connection/isolation elements is arranged. In this RC network, the number m of resistance elements of the second series is either equal to n or less than the number n of resistance elements of the first series and the resistance value of each resistance element of the first series is much greater than the resistance value of each resistance element of the second series. In this RC network, the capacitance elements can in each case be connected to or isolated from the substrate by one of their ends and, by their other end, can be connected to or isolated from at least some of the first resistance elements of the first resistance series in each case via a further connection/isolation element. Further connection/isolation elements are located between the ends of the first resistance elements and the ends of the second resistance elements, so that the connection/isolation elements enable a connection in parallel/disconnection of a respective second resistance element with/from a respective first resistance element.

Preferably, the substrate of the RC network is shared with the chip substrate.

In a preferred embodiment, the RC network according to the invention is formed from a plurality of MOS field-effect transistors arranged in parallel next to one another in a series. In this case, the capacitance elements are formed in each case by the drain/substrate, source/substrate, drain/gate and source/gate capacitances of each MOS field-effect transistor. In this preferred embodiment of the RC network, the resistance elements of the first resistance series are formed in each case by the drain and source diffusion regions of the MOS field-effect transistors, and the resistance elements of the second resistance series are formed in each case by the section of the connection tracks for the contact connection of the drain and source diffusion regions of the MOS field-effect transistors.

These connection tracks are preferably composed of metal, so that the individual sections of the connection tracks which form the resistance elements of the second resistance series definitely have a very much smaller resistance value than the sections of the drain and source diffusion regions of the MOS field-effect transistors which form the resistance elements of the first resistance series.

In this preferred embodiment of the circuit configuration according to the invention, the connection/isolation elements are either provided at the respective contact sections of the common connection tracks between the individual MOS field-effect transistors and also at the contact sections between the common connection tracks and the drain and source diffusion regions or they are alternatively either laser-trimmable or electrically switchable fuses at these positions.

Preferably, in this embodiment of the RC network according to the invention, the MOS transistors are subdivided into a plurality of groups which allow a simple partitioning of the RC network by connection/isolation elements respectively arranged between the groups.

It will be readily understood that the invention is not restricted to a first resistance series and a second resistance series arranged in parallel therewith. As an alternative and in a similar construction it is also possible to provide a first, second and third resistance series, the resistance values of the resistance elements located in the first, second and third resistance series decreasing from the first to the third resistance series. RC networks having more than three resistance series also lie within the scope of the invention.

In the preferred embodiment of the circuit configuration according to the invention, by trimming the connection tracks, for example by laser trimming, or by providing a respective mask, the input resistance and the input capacitance can be set independently in a simple manner during the production of the semiconductor circuit chip. This also applies to the case where the connection/isolation elements are laser-trimmable or electrically switchable fuses.

Other features which are considered as characteristic for the invention are set forth in the appended claims.

Although the invention is illustrated and described herein as embodied in a circuit configuration for setting the input resistance and the input capacitance of an integrated semiconductor circuit chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
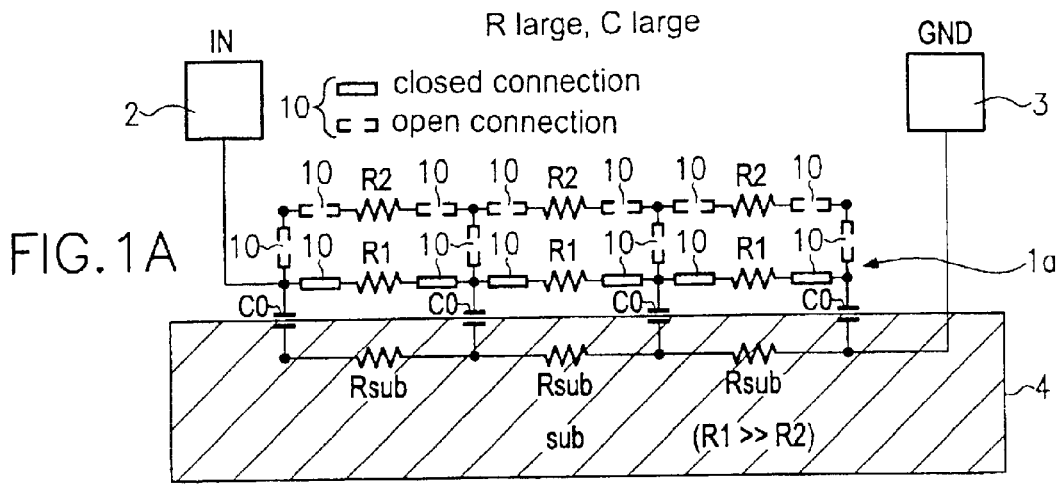
FIGS. 1A, 1B and 1C are diagrams and equivalent circuit diagram of a circuit configuration according to the invention with an RC network that has two resistance series each having the same number of resistance elements and in which three different configurations of the input resistance R and of the input capacitance C are set by different connection/isolation of the respective connection/isolation elements.
Figure 1B:
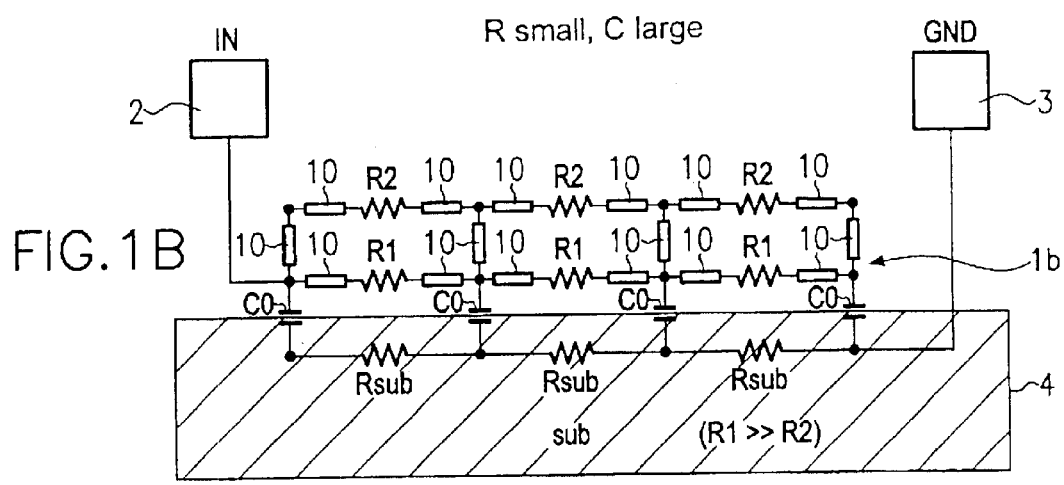
Figure 1C:
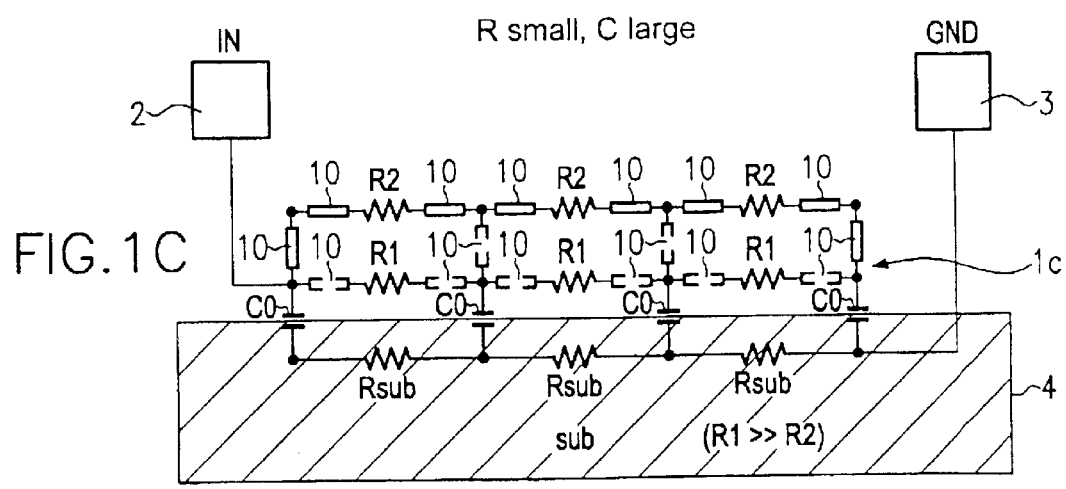

Referring now to the figures of the drawing in detail and first, particularly, to FIGS. 1A to 1C thereof, there are shown, in each case in an equivalent circuit diagram, three different states of a first embodiment of a circuit configuration according to the invention for setting the input resistance R and the input capacitance C of a semiconductor circuit chip. The chip is indicated schematically with an input pad or pin (IN) 2, a ground node (GND) 3, and a substrate (Sub) 4. The RC network in FIGS. 1A–1C has three different connection/isolation states, which are respectively designated by the reference symbols 1a, 1b and 1c. The state of the RC network 1a in FIG. 1A produces a large value of the input resistance R and a large input capacitance C between the IN pad 2 and the GND pad 3, in accordance with the state of respective connection/isolation elements 10. In accordance with FIG. 1B, the state of the RC network 1b is set by the correspondingly connected connection/isolation elements 10 such that a small input resistance R and a large input capacitance are established between the IN pad 2 and the GND pad 3. In accordance with FIG. 1C, through the setting of the connection/isolation elements, the state of the RC network 1C is chosen such that the input resistance R and likewise the input capacitance C between the IN pad 2 and the GND pad 3 are small.

FIGS. 1A–1C show that the RC network 1a, 1b, 1c comprises two resistance series having an in each case identical number (n=m) of the first resistance elements having the value R1 and second resistance elements having the value R2. The resistance R1 is much greater than R2, that is R1>>R2 (the term "much greater" may be understood as at least one order of magnitude). The resistance values of the resistance elements R1 of the first resistance series are preferably identical to one another. The same applies to the resistance values of the resistance elements R2 of the second resistance series. It is clear from FIGS. 1A–1C that many connection/isolation elements 10 are arranged in each case between the resistance elements R1 of the first resistance series and between the resistance elements R2 of the second resistance series such that, through an optional connection/isolation of the connection/isolation elements 10,

- ■ the individual resistance elements R1 of the first resistance series can be connected to one another in series/disconnected from one another, to be precise each resistance element R1 for itself,
- ■ the resistance elements R2 of the second resistance series can be individually connected to one another in series/disconnected from one another, and that each resistance element of the first resistance series R1 can be connected in parallel with a resistance element R2 of the second resistance series, and
- ■ the ends of the resistance elements R1 and R2 of the first and second resistance series can optionally be connected to/disconnected from capacitance elements C0. The capacitance elements C0 lead to the substrate 4, where their ends there connect to the individual substrate resistances $R_{sub}$.

The configuration of the RC network shown in FIG. 1A is set according to the state of the connection/isolation elements 10 such that only the ends of all the resistance elements R1 of the first resistance series are connected to the corresponding capacitance elements C0, thus resulting in a large input resistance R and a large input capacitance C between the IN pad 2 and the GND pad 3.

By contrast, the configuration of the RC network 1b as shown in FIG. 1B is set by the corresponding state of the connection/isolation elements 10 such that all the resistance elements R2 of the second resistance series are connected in parallel with all the resistance elements R1 of the first resistance series and this parallel circuit is connected to all the capacitance elements C0, thus resulting in a small input resistance R and a large input capacitance C between the IN pad 2 and the GND pad 3.

Finally, in FIG. 1C, the configuration of the RC network 1c is chosen according to the state of the connection/isolation elements 10 such that all the resistance elements R1 of the first resistance series are decoupled and only the resistance elements R2 of the second resistance series are coupled to the corresponding capacitance elements C0, so that a small input resistance R and a small input capacitance are established between the IN pad 2 and the GND pad 3.

It is necessary that the states of the respective connection/isolation elements can be set at the wafer or chip level in a simple manner in one step, for example by way of corresponding masking.

It should be readily understood from the above description that the configurations 1a, 1b and 1c of the RC network as shown in FIGS. 1A–1C are merely exemplary and that this RC network can be used to set many intermediate states between a large input resistance and a small input resistance, on the one hand, and large input capacitance and small input capacitance, on the other hand, depending on the connection state/isolation state of the connection/isolation elements 10.

Figure 2:
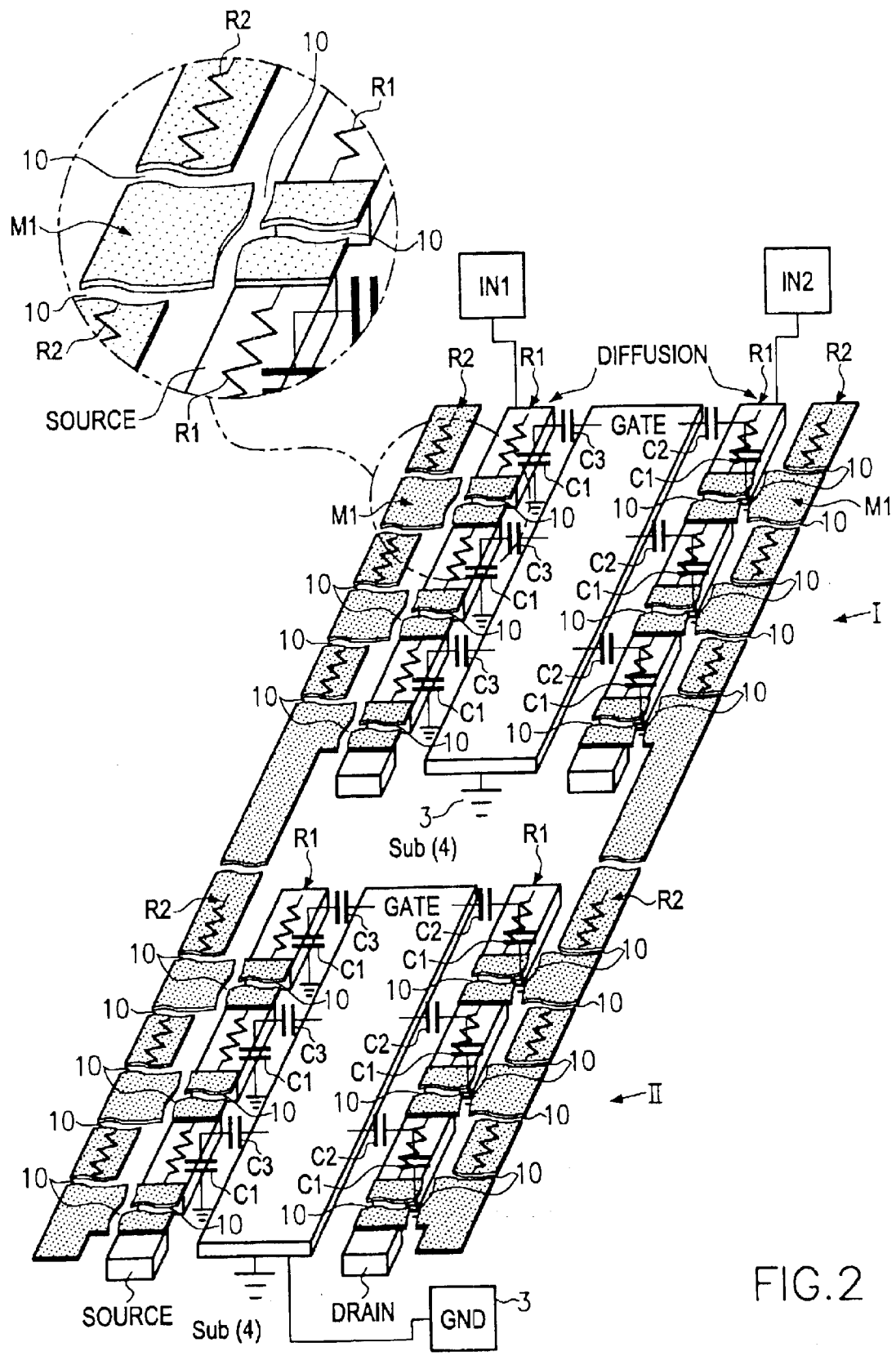
FIG. 2 is a perspective diagram, including an enlarged detail, of a preferred realization of an RC network—having two resistance series—in accordance with FIGS. 1A–1C comprising MOS field-effect transistors lined up next to one another.

FIG. 2 shows how the circuit configuration described above in the equivalent circuit diagram with reference to FIGS. 1A–1C is preferably realized in an integrated circuit chip 5. FIG. 2 shows in perspective and diagrammatically a plurality of MOS field-effect transistors lined up next to one another. The capacitance elements C0 are formed in each case by the drain/substrate, source/substrate, drain/gate and source/gate capacitances C1, C2 and C3 of the MOS field-effect transistors. The resistance elements R1 of the first resistance series are formed in each case by the diffused source and drain zones of the individual MOS field-effect transistors, which are in each case interconnected by metal tracks. These connection metallizations are connected to common metallization tracks M1, which form the resistance elements R2 of the second resistance series.

The enclarged detail at the upper left corner of FIG. 2 shows connection/isolation elements 10 in the isolation state in each case between resistance elements R1 of the first resistance series, resistance elements R2 of the second resistance series and between the metallization track M1 and the connecting bridge to the source diffusion zone. It should be noted that, for simplification, the perspective illustration of FIG. 2 does not illustrate all possible connection/isolation elements 10 of FIGS. 1A–1C. Furthermore, it is noticeable that the MOS field-effect transistors in accordance with FIG. 2 are grouped in two groups. The RC networks I, II formed by the two MOS field-effect transistor groups can be partitioned and connected together by means of connection/isolation elements 10 located between the two groups in the metallization tracks M1. FIG. 2 diagrammatically illustrates two possible input pads IN1 and IN2, a substrate Sub 4 and a GND pad. It is clear to the person skilled in the art that the source and drain diffusion regions have a high sheet resistance and thus define the high resistance values of the resistance elements R1. By contrast, the metallization tracks M1 and M2 have a comparatively low resistance value, so that they define the relatively small resistance R2 of the resistance elements of the second resistance series. Through optional connection/isolation of the metallization tracks M1 at the connection/isolation elements indicated, it is possible, in accordance with the above description, to set both the capacitance values and the resistance values independently of one another in one step. Further setting possibilities not shown in FIG. 2 comprise laser-trimmable or electrically switchable fuses. In this case, it is only after the complete processing of the integrated semiconductor circuit that the connections by the metallization tracks M1 can subsequently be interrupted and the input resistance R and the input capacitance C can thus be trimmed.

Figure 3:
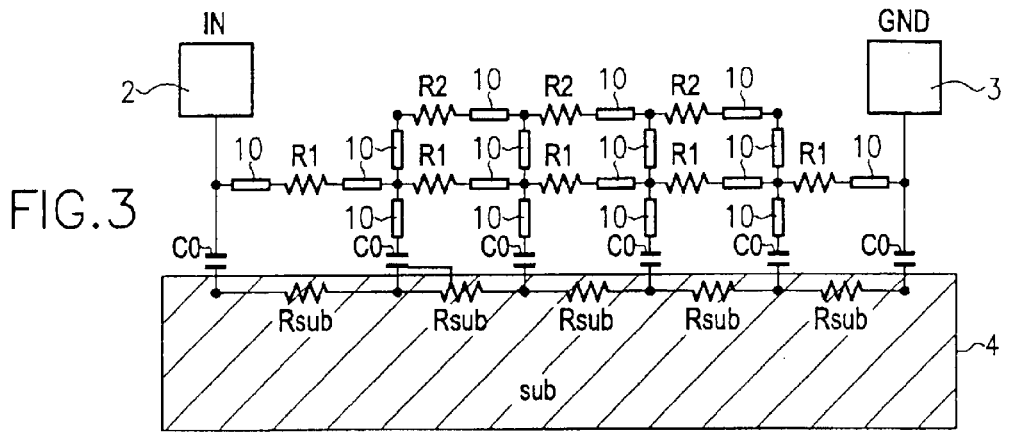
FIG. 3 is an equivalent circuit diagram of a variation of the RC network shown in FIGS. 1A–1C, in which the number of resistance elements of the second resistance series is less than the number of resistance elements of the first resistance series.

FIG. 3 shows, in the equivalent circuit diagram, a variant of the circuit configuration according to the invention, in which the RC network has a different n of resistance elements R1 of the first resistance series compared with the number m of resistance elements R2 of the second resistance series, in other words the number m of resistance elements R2 is less than the number n of resistance elements of the first resistance series of the RC network. Here, too, R1>>R2 holds true. The rest of the circuit configuration of FIG. 3 is identical to that shown in FIGS. 1A–1C. In this case, the connection/isolation elements 10 are all in the connected state, so that, as in FIG. 1B, a small input resistance and a large input capacitance are set with the RC network illustrated in FIG. 3.

Figure 4:
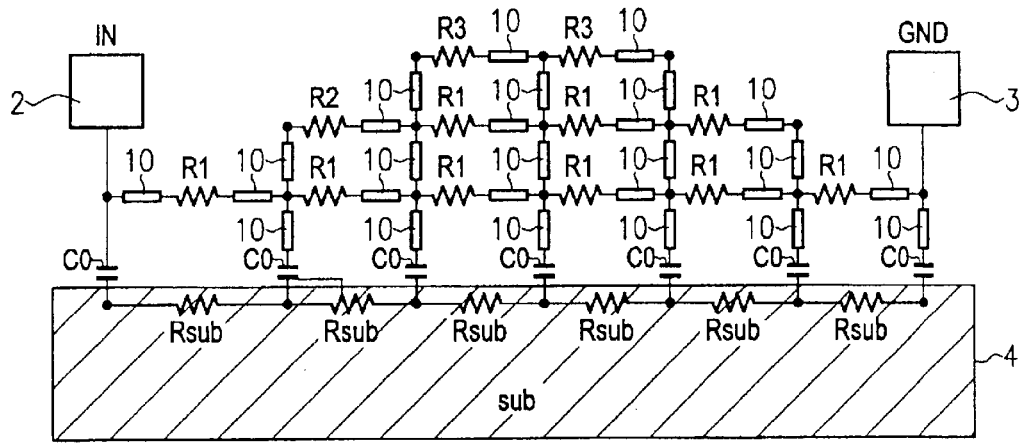
FIG. 4 is an equivalent circuit diagram of a further variant of an RC network according to the invention, having three resistance series.
Figure 5:
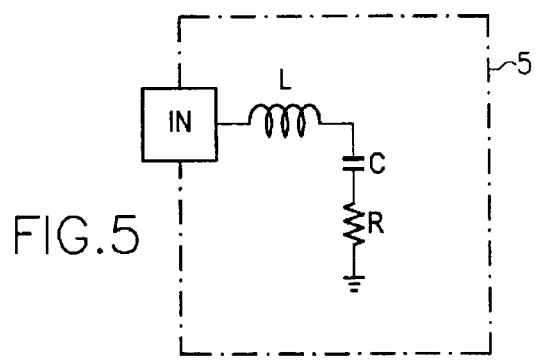
FIG. 5 is a circuit schematic of the basic input structure of an integrated semiconductor circuit as already described in the introduction.

FIG. 4 shows, in an equivalent circuit diagram, a further variant of a circuit configuration according to the invention with three resistance series. The first and second resistance series with the resistance elements R1 and R2 are similar to the configuration in FIG. 3. The third resistance series contains third resistance elements R3. The resistance values of the first resistance elements R1 are much greater than the resistance values of the second resistance elements R2, and these are in turn much greater than those of the third resistance elements R3. Here, too, the connection/isolation elements 10 are illustrated in their connected state, as in FIG. 3.

All the above-described exemplary embodiments and variants of the circuit configuration according to the invention have the advantage that they provide an RC network which can be integrated with the integrated semiconductor circuit chip and enables a setting of the characteristic input quantities R and C independently of one another on the chip by means of a single mask or a single fuse trimming operation, so that desired values for said characteristic input quantities R and C can be set in a simple manner during chip production and no complicated additional structures are necessary.

We claim:

1. A circuit configuration for setting an input resistance and an input capacitance of an integrated semiconductor circuit chip, the chip having an input and a ground node coupled to a substrate, the circuit configuration comprising:

an RC network connected between the input and the ground node of the chip, said RC network containing:
a plurality of resistance series disposed in parallel between the input and the ground node, each of said resistance series having a plurality of individual resistance elements to be selectively connected/ disconnected in a series connection, said resistance elements can be selectively connected in parallel individually or in a plurality thereof to one or to a plurality of said resistance elements of an adjacent one of said resistance series;

a plurality of capacitance elements which can be selectively connected from ends of said resistance elements of said resistance series to the substrate; and a plurality of connection/isolation elements each disposed for series connection between said ends of series connected resistance elements of each of said resistance series and for parallel connection between said ends of said parallelly adjacent resistance elements of said resistance series, individually or a plurality of said connection/isolation elements can be selectively placed in a connection state or an isolation state in one step for setting the input resistance and the input capacitance of the semiconductor circuit chip.

2. The circuit configuration according to claim 1, wherein said plurality of resistance series comprises:

a first resistance series; and a second resistance series connected in parallel with said first resistance series;

and wherein:

said first resistance series has n first resistance elements in each case of a first resistance value, and at least one of said connection/isolation elements is in each case arranged between each of said first resistance elements; and said second resistance series has m second resistance elements in each case of a second resistance value, and at least one of said connection/isolation elements is in each case arranged between each of said second resistance elements;

m≦n, and m and n are integers; and a resistance value of each said first resistance elements is much greater than a resistance value of each said second resistance elements.

3. The circuit configuration according to claim 2 commonly integrated on the substrate with the semiconductor circuit chip.

4. The circuit configuration according to claim 1 commonly integrated in the substrate with the semiconductor circuit chip.

5. The circuit configuration according to claim 1, wherein said plurality of resistance series comprises a first resistance series and a second resistance series and said RC network is formed of a plurality of MOS field-effect transistors lined up in parallel next to one another, and wherein:

each said MOS field-effect transistor has a drain, a source, a gate, and a drain and source diffusion region contacted via connection tracks, and said capacitance elements are formed by drain/substrate capacitances, source/substrate capacitances, drain/gate capacitances, and source/gate capacitances;

said drain and source diffusion regions of said MOS field-effect transistors form said resistance elements of said first resistance series; and portions of said connection tracks for connecting said drain and source diffusion regions of said MOS field-effect transistors in each case form said resistance elements of said second resistance series.

6. The circuit configuration according to claim 5, wherein said connection/isolation elements are defined at respective contact sections of said connection tracks between individual MOS field-effect transistors and contact sections between said connection tracks and respective drain and source diffusion regions of said MOS field-effect transistors.

7. The circuit configuration according to claim 5, wherein said MOS transistors forming said RC network are divided into a plurality of groups, and said connection/isolation elements are disposed at common interconnects between the respective groups.

8. The circuit configuration according to claim 7, wherein said groups of said MOS transistors forming said RC network are disposed linearly one after another.

9. The circuit configuration according to claim 5, wherein a common connection track and contact segments connecting said common connection track to said drain and source diffusion regions of said MOS field-effect transistors are composed of metal.

10. The circuit configuration according to claim 1, wherein said connection/isolation elements are laser-trimmable fuses.

11. The circuit configuration according to claim 1, wherein said connection/isolation elements are electrically switched fuses.

* * * * *